United States Patent
Sakaguchi

(10) Patent No.: US 9,473,720 B2
(45) Date of Patent: Oct. 18, 2016

(54) SOLID-STATE IMAGE-CAPTURING DEVICE AND IMAGE-CAPTURING DEVICE

(71) Applicant: OLYMPUS CORPORATION, Tokyo (JP)

(72) Inventor: Naofumi Sakaguchi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/816,699

(22) Filed: Aug. 3, 2015

(65) Prior Publication Data

US 2015/0341582 A1 Nov. 26, 2015

Related U.S. Application Data

(63) Continuation of application No. PCT/JP2014/051761, filed on Jan. 28, 2014.

(30) Foreign Application Priority Data

Feb. 6, 2013 (JP) ................................ 2013-021726

(51) Int. Cl.
*H04N 5/374* (2011.01)
*H01L 27/146* (2006.01)
(Continued)

(52) U.S. Cl.
CPC ...... *H04N 5/3741* (2013.01); *H01L 27/14612* (2013.01); *H01L 27/14634* (2013.01);
(Continued)

(58) Field of Classification Search
CPC .. H04N 5/3741; H04N 5/63; H04N 5/37457; H04N 5/361; H04N 5/2176; H04N 5/363; H04N 5/378; H01L 27/14641; H01L 27/14612; H01L 27/14634
See application file for complete search history.

(56) References Cited

U.S. PATENT DOCUMENTS

2012/0119272 A1* 5/2012 Inui .................... H01L 27/14689
257/292
2013/0070133 A1 3/2013 Takazawa
(Continued)

FOREIGN PATENT DOCUMENTS

JP 2012-248952 A 12/2012
JP 2012-248953 A 12/2012
(Continued)

OTHER PUBLICATIONS

International Search Report dated May 13, 2015, issued in counterpart International Application No. PCT/JP2014/051761 (3 pages).

*Primary Examiner* — Twyler Haskins
*Assistant Examiner* — Padma Haliyur
(74) *Attorney, Agent, or Firm* — Westerman, Hattori, Daniels & Adrian, LLP

(57) ABSTRACT

A solid-state image-capturing device has a plurality of pixels and first and second substrates in which circuit elements constituting the pixels are arranged and which are electrically connected through a connection unit. The solid-state image-capturing device includes: a photoelectric conversion element included in the pixel of the first substrate; a first current source; a first amplification transistor having a source or a drain connected to the first current source and a gate to which a signal generated by the photoelectric conversion element is input; a second current source; a switch configured to switch ON and OFF of a connection between a vertical signal line and the second current source and to be turned off when the gate of the first amplification transistor is reset; a voltage output circuit configured to output a power supply voltage to the vertical signal line when the gate of the first amplification transistor is reset.

6 Claims, 10 Drawing Sheets

(51) Int. Cl.
  *H04N 5/63*    (2006.01)
  *H04N 5/363*   (2011.01)
  *H04N 5/378*   (2011.01)
  *H04N 5/217*   (2011.01)
  *H04N 5/361*   (2011.01)
  *H04N 5/3745*  (2011.01)

(52) U.S. Cl.
  CPC ...... *H01L27/14641* (2013.01); *H04N 5/2176* (2013.01); *H04N 5/361* (2013.01); *H04N 5/363* (2013.01); *H04N 5/378* (2013.01); *H04N 5/37457* (2013.01); *H04N 5/63* (2013.01)

(56) References Cited

U.S. PATENT DOCUMENTS

2013/0126710 A1\* 5/2013 Kondo .............. H01L 27/14609
                                                        250/208.1
2014/0077067 A1\* 3/2014 Matsunaga ......... H01L 27/1463
                                                        250/208.1

FOREIGN PATENT DOCUMENTS

JP    2012-257037 A    12/2012
JP    2013-16963 A     1/2013

\* cited by examiner

SOLID-STATE IMAGE-CAPTURING DEVICE AND IMAGE-CAPTURING DEVICE

CROSS REFERENCE TO RELATED APPLICATIONS

This application is a continuation application based on a PCT Patent Application No. PCT/JP2014/051761, filed Jan. 28, 2014, whose priority is claimed on Japanese Patent Application No. 2013-021726, filed Feb. 6, 2013, the entire content of which are hereby incorporated by reference.

BACKGROUND OF THE INVENTION

1. Field of the Invention

The present invention relates to a solid-state image-capturing device and an image-capturing device having a plurality of pixels and first and second substrates in which circuit elements constituting the pixels are arranged and which are electrically connected through a connection unit.

2. Description of the Related Art

In recent years, video cameras, electronic still cameras, and the like have been widely popularized. A charge coupled device (CCD)-type or amplification-type solid-state image-capturing device is used for such a camera. The amplification-type solid-state image-capturing device guides signal charges generated and stored by a photoelectric conversion unit of a pixel on which light is incident to an amplification unit in the pixel, and outputs the signal amplified by the amplification unit from the pixel. In the amplification-type solid-state image-capturing device, a plurality of pixels are arranged in a two-dimensional matrix shape. The amplification-type solid-state image-capturing device, for example, includes a complementary metal oxide semiconductor (CMOS)-type solid-state image-capturing device using a CMOS transistor.

Conventionally, a general CMOS-type solid-state image-capturing device adopts a scheme of sequentially reading signal charges generated by photoelectric conversion units of the pixels arranged in a two-dimensional matrix shape for every row. In this scheme, because a timing of exposure in the photoelectric conversion unit of each pixel is determined by the start and end of reading of signal charges, the exposure timing differs for each row. Thus, when an image of an object in fast motion is captured using the CMOS-type solid-state image-capturing device, the object is distorted within the captured image.

In order to eliminate the distortion of the object, a simultaneous image-capturing function (global shutter function) of implementing simultaneity of storage of signal charges has been proposed. In addition, the use of a CMOS-type solid-state image-capturing device having the global shutter function is increasing. In the CMOS-type solid-state image-capturing device having the global shutter function, it is generally necessary to have a storage capacitance unit with a light shielding property in order to store signal charges generated by a photoelectric conversion unit until reading is performed. In this conventional CMOS-type solid-state image-capturing device, after all pixels are simultaneously exposed, signal charges generated by the photoelectric conversion units are simultaneously transferred from all of the pixels to storage capacitance units and temporarily stored in the storage capacitance units. Also, the signal charges are sequentially converted into pixel signals and read at a predetermined reading timing.

However, because the photoelectric conversion unit and the storage capacitance unit should be created on the same plane of the same substrate in the conventional CMOS-type solid-state image-capturing device having the global shutter function, an increase in a chip area is inevitable. Further, there is a problem in that the quality of a signal is deteriorated due to noise caused by light or noise caused by a leak current (dark current) occurring in the storage capacitance unit during a waiting period until signal charges stored in the storage capacitance unit are read.

In order to solve this problem, a method of preventing a chip area from increasing and preventing signal quality from deteriorating according to a structure in which a first substrate in which photoelectric conversion units are formed and a second substrate in which a plurality of MOS transistors are formed are bonded is disclosed in Japanese Unexamined Patent Application, First Publication No. 2012-248952.

However, when strong light has been incident on the solid-state image-capturing device, the reset level which is the reference potential changes to a level different from an ideal level due to the influence of light and a blackening phenomenon in which there is no difference between the signal level based on the signal charges stored in the photoelectric conversion unit and the reset level occurs. In order to solve this problem, suppressing the blackening phenomenon by providing a clip circuit for fixing the reset level in the solid-state image-capturing device having a structure in which two substrates are bonded is disclosed in Japanese Unexamined Patent Application, First Publication No. 2012-257037.

SUMMARY

According to a first aspect of the present invention, there is provided a solid-state image-capturing device having a plurality of pixels and first and second substrates in which circuit elements constituting the pixels are arranged and which are electrically connected through a connection unit, the solid-state image-capturing device including: a photoelectric conversion element included in the pixel of the first substrate; a first current source; a first amplification transistor having a source or a drain connected to the first current source and a gate to which a signal generated by the photoelectric conversion element is input; a second current source; a switch configured to switch ON and OFF of a connection between a vertical signal line and the second current source and to be turned off when the gate of the first amplification transistor is reset; a voltage output circuit configured to output a power supply voltage to the vertical signal line when the gate of the first amplification transistor is reset; a clip transistor having one of a source and a drain connected to the vertical signal line, the other of the source and the drain connected to the first current source, and a gate to which a predetermined voltage for fixing a voltage output from the other of the source and the drain is input when the gate of the first amplification transistor is reset; a storage circuit included in the pixel of the second substrate and configured to store a signal amplified by the first amplification transistor and the clip transistor; and a second amplification transistor having one of a source and a drain connected to the vertical signal line and a gate to which the signal stored in the storage circuit is input.

According to a second aspect of the present invention, there is provided a solid-state image-capturing device having a plurality of pixels and first and second substrates in which circuit elements constituting the pixels are arranged and which are electrically connected through a connection unit, the solid-state image-capturing device including: a photoelectric conversion element included in the pixel of the first substrate; a first current source; a first amplification transistor having a source or a drain connected to the first current source and a gate to which a signal generated by the photoelectric conversion element is input; a second current source connected to a vertical signal line and configured to switch ON and OFF and to be turned off when the gate of the first amplification transistor is reset; a voltage output circuit configured to output a power supply voltage to the vertical signal line when the gate of the first amplification transistor is reset; a clip transistor having one of a source and a drain connected to the vertical signal line, the other of the source and the drain connected to the first current source, and a gate to which a predetermined voltage for fixing a voltage output from the other of the source and the drain is input when the gate of the first amplification transistor is reset; a storage circuit included in the pixel of the second substrate and configured to store a signal amplified by the first amplification transistor and the clip transistor; and a second amplification transistor configured to amplify the signal stored in the storage circuit to output the amplified signal to the vertical signal line.

According to a third aspect of the present invention, there is provided a solid-state image-capturing device having a plurality of pixels and first and second substrates in which circuit elements constituting the pixels are arranged and which are electrically connected through a connection unit, the solid-state image-capturing device including: a photoelectric conversion element included in the pixel of the first substrate; a current source; an amplification transistor having a source or a drain connected to the first current source and a gate to which a signal generated by the photoelectric conversion element is input; a test transistor having one of a source and a drain connected to a test voltage corresponding to a reset level and a signal level during a test and connected to a power supply voltage when the gate of the amplification transistor is reset, the other of the source and the drain connected to the current source, and a gate to which a predetermined voltage for fixing a voltage output from the other of the source and the drain is input when the gate of the amplification transistor is reset; a storage circuit included in the pixel of the second substrate and configured to store a signal amplified by the amplification transistor and the test transistor; and an output circuit configured to output the signal stored in the storage circuit.

According to a fourth aspect of the present invention, an image-capturing device may have the solid-state image-capturing device according to any one of the first to third aspects.

DETAILED DESCRIPTION OF THE PREFERRED EMBODIMENTS

Figure 1:
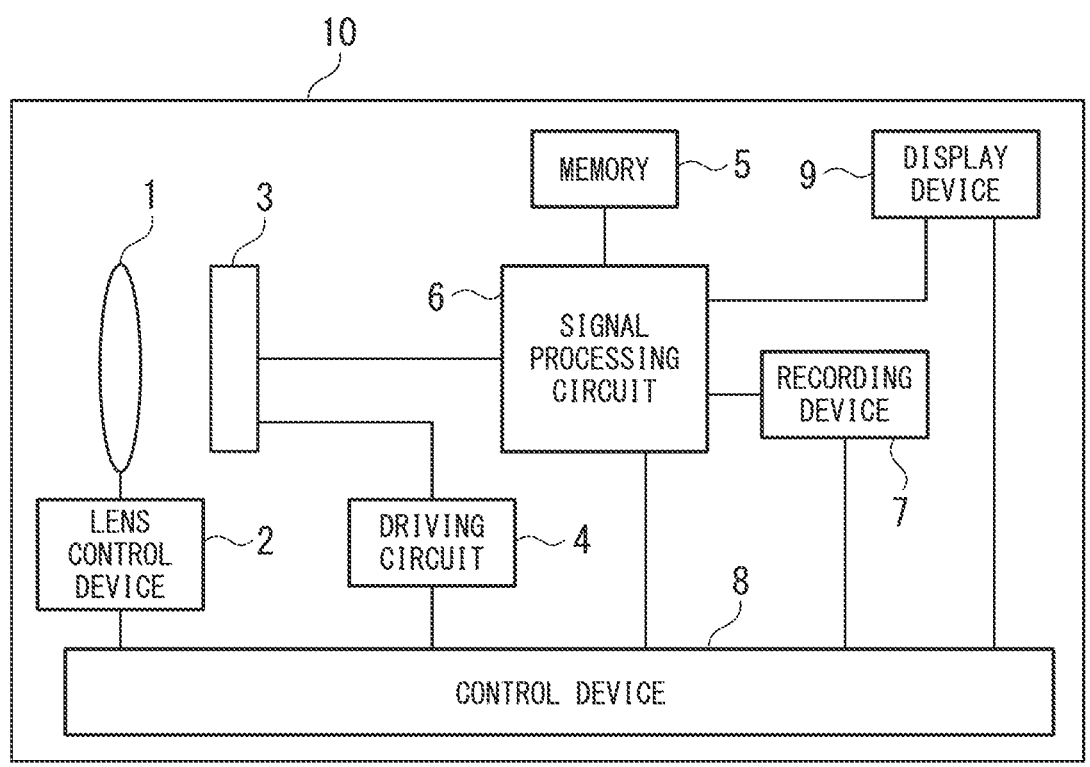
FIG. 1 is a block diagram illustrating a configuration of an image-capturing device to which a solid-state image-capturing device according to a first embodiment of the present invention is applied.

Hereinafter, embodiments of the present invention will be described with reference to the drawings. FIG. 1 illustrates a configuration of a digital camera as an example of an image-capturing apparatus to which a solid-state image-capturing device according to the present embodiment has been applied. The image-capturing apparatus according to an aspect of the present invention may be an electronic device having an image-capturing function or may be a digital video camera, an endoscope or the like, as well as a digital camera. The digital camera 10 illustrated in FIG. 1 includes a lens unit 1, a lens control device 2, a solid-state image-capturing device 3, a driving circuit 4, a memory 5, a signal processing circuit 6, a recording device 7, a control device 8, and a display device 9.

The lens unit 1 includes a zoom lens or a focus lens and forms an object image on a light receiving surface of the solid-state image-capturing device 3 using light from an object. The lens control device 2 controls zoom, focus, a diaphragm and the like of the lens unit 1. The light captured by the lens unit 1 forms an image on the light receiving surface of the solid-state image-capturing device 3. The solid-state image-capturing device 3 converts the object image formed on the light receiving surface into an image signal and outputs the image signal. A plurality of pixels are two-dimensionally arranged in a row direction and a column direction in the light receiving surface of the solid-state image-capturing device 3.

The driving circuit 4 drives the solid-state image-capturing device 3 to control an operation of the solid-state image-capturing device 3. The memory 5 temporarily stores image data. The signal processing circuit 6 performs predetermined processes on an image signal output from the solid-state image-capturing device 3. The processes performed by the signal processing circuit 6 include amplification of the image signal, various corrections of image data, compression of image data, and the like.

The recording device 7 includes a semiconductor memory for recording or reading of the image data and is detachably embedded in the digital camera 10. The display device 9 performs display of a moving image (live view image), display of a still image, display of a moving image or a still image recorded on the recording device 7, display of a state of the digital camera 10, etc.

The control device 8 performs the overall control of the digital camera 10. An operation of the control device 8 is defined by a program stored in a read only memory (ROM) embedded in the digital camera 10. The control device 8 reads the program and performs various controls according to content defined by the program.

Figure 2:
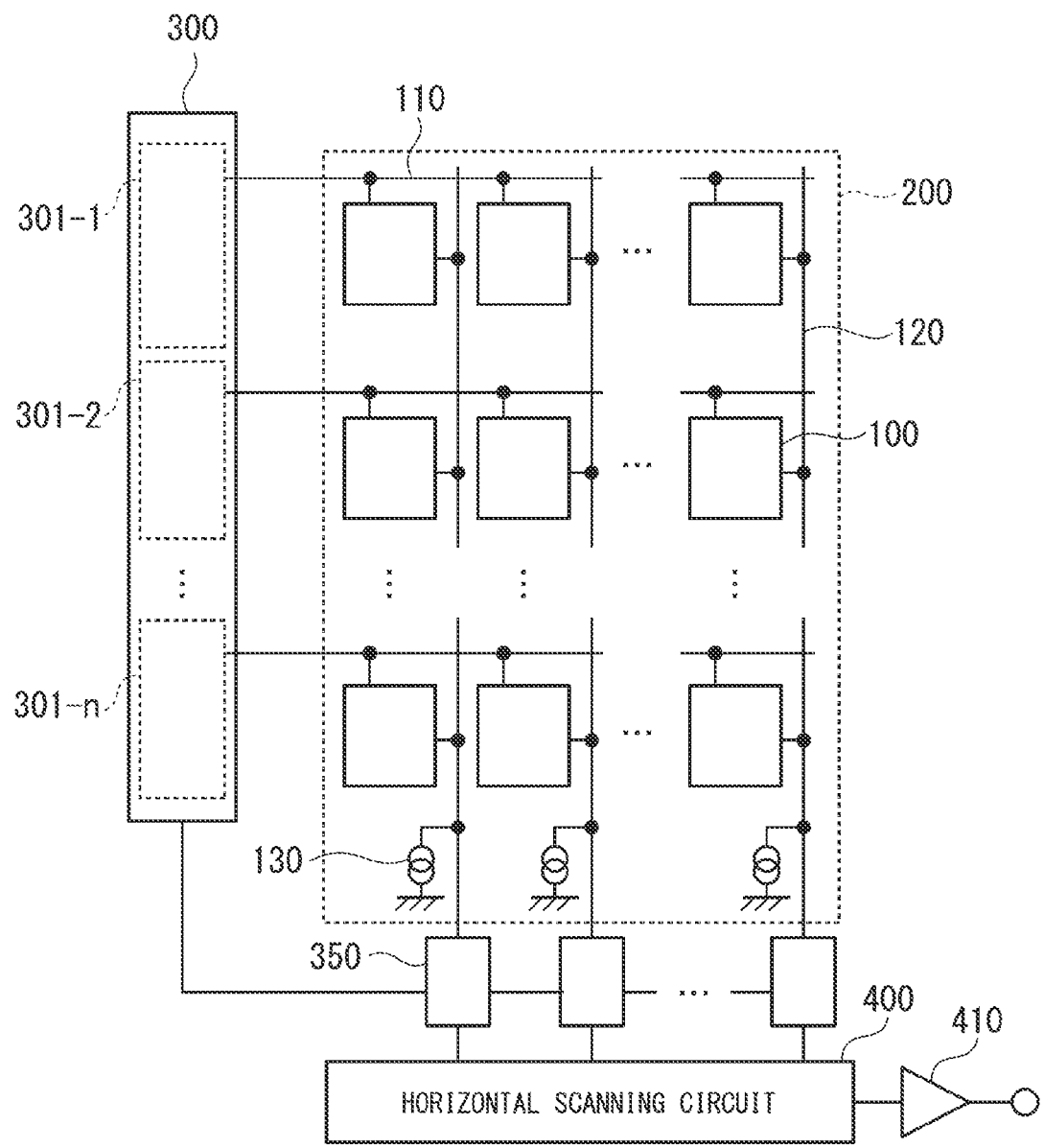
FIG. 2 is a block diagram illustrating a configuration of the solid-state image-capturing device according to the first embodiment of the present invention.

FIG. 2 illustrates a configuration of the solid-state image-capturing device 3. The solid-state image-capturing device illustrated in FIG. 2 includes a pixel unit 200 (a pixel array), a vertical scanning circuit 300, a column processing circuit 350, a horizontal scanning circuit 400, and an output amplifier 410. An arrangement position of each circuit element illustrated in FIG. 2 does not necessarily match an actual arrangement position.

The pixel unit 200 includes pixels 100 arranged in a two-dimensional matrix shape, and a current source 130 provided in each column. In this embodiment, while a region including all the pixels in the solid-state image-capturing device 3 serves as a pixel signal reading target region, a part of the region including all the pixels in the solid-state image-capturing device 3 may be the reading target region. It is desirable for the reading target region to include at least all pixels in an effective pixel region. In addition, the reading target region may include optical black pixels (constantly shielded pixels) arranged outside the effective pixel region. A pixel signal read from the optical black pixel is used, for example, to correct a dark current component.

The vertical scanning circuit 300 performs driving control of the pixel unit 200 in units of rows. In order to perform this driving control, the vertical scanning circuit 300 includes unit circuits 301-1, 301-2, . . . , 301-n (n is the number of rows) equal in number to rows.

Each unit circuit 301-i (i=1, 2, . . . , n) outputs a control signal for controlling the pixels 100 corresponding to one row to a signal line 110 provided for every row. The signal line 110 is connected to the pixel 100 and supplies a control signal output from the unit circuit 301-i to the pixel 100. While each signal line 110 corresponding to a row is represented as one line in FIG. 2, each signal line 110 includes a plurality of signal lines. A signal of the pixel 100 of the row selected by the control signal is configured to be output to a vertical signal line 120 provided for every column.

The current source 130 is connected to the vertical signal line 120 and constitutes a source follower circuit with an amplification transistor (a second amplification transistor 241, 242, 243, or 244 to be described below) within the pixel 100. The column processing circuit 350 performs signal processing such as noise suppression on the pixel signal output to the vertical signal line 120. The horizontal scanning circuit 400 outputs pixel signals of the pixels 100 corresponding to one row, which have been output to the vertical signal line 120 and processed by the column processing circuit 350, to the output amplifier 410 in time series in order of arrangement in a horizontal direction. The output amplifier 410 amplifies the pixel signal output from the horizontal scanning circuit 400 and outputs the amplified signal as an image signal to the outside of the solid-state image-capturing device 3.

Figure 3:
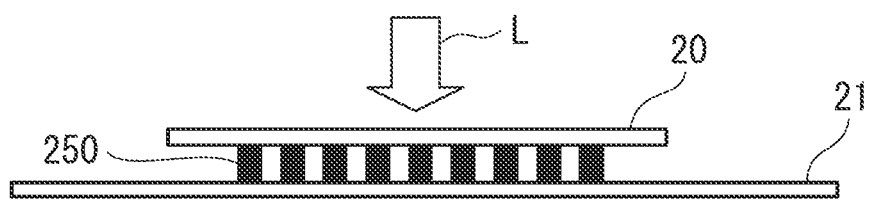
FIG. 3 is a cross-sectional view of the solid-state image-capturing device according to the first embodiment of the present invention.

FIG. 3 illustrates a cross-sectional structure of the solid-state image-capturing device 3. The solid-state image-capturing device 3 has a structure in which two substrates (a first substrate 20 and a second substrate 21) in which circuit elements (e.g., photoelectric conversion elements, transistors, and capacitors) constituting the pixels 100 are arranged overlap. The circuit elements in the pixels 100 are distributed and arranged in the first substrate 20 and the second substrate 21. The first substrate 20 and the second substrate 21 are electrically connected so that an electrical signal can be transmitted and received between the two substrates at the time of driving the pixels 100.

The photoelectric conversion elements are formed in a main surface irradiated with light L between two main surfaces (surfaces having a relatively greater surface area than side surfaces) of the first substrate 20. The light radiated to the first substrate 20 is incident on the photoelectric conversion elements. A connection unit 250 for a connection with the second substrate 21 is formed in the main surface opposite to the main surface irradiated with the light L between the two main surfaces of the first substrate 20. A signal based on signal charges generated by the photoelectric conversion element arranged in the first substrate 20 is output to the second substrate 21 via the connection unit 250. The main surfaces of the first substrate 20 and the second substrate 21 have different areas in an example illustrated in FIG. 3, but the main surfaces of the first substrate 20 and the second substrate 21 may have the same area.

Each of the vertical scanning circuit 300, the column processing circuit 350, the horizontal scanning circuit 400, and the output amplifier 410 other than the pixels 100 may be arranged in any one of the first substrate 20 and the second substrate 21. In addition, circuit elements constituting the vertical scanning circuit 300, the column processing circuit 350, the horizontal scanning circuit 400, and the output amplifier 410 may be distributed and arranged in the first substrate 20 and the second substrate 21.

Figure 4:
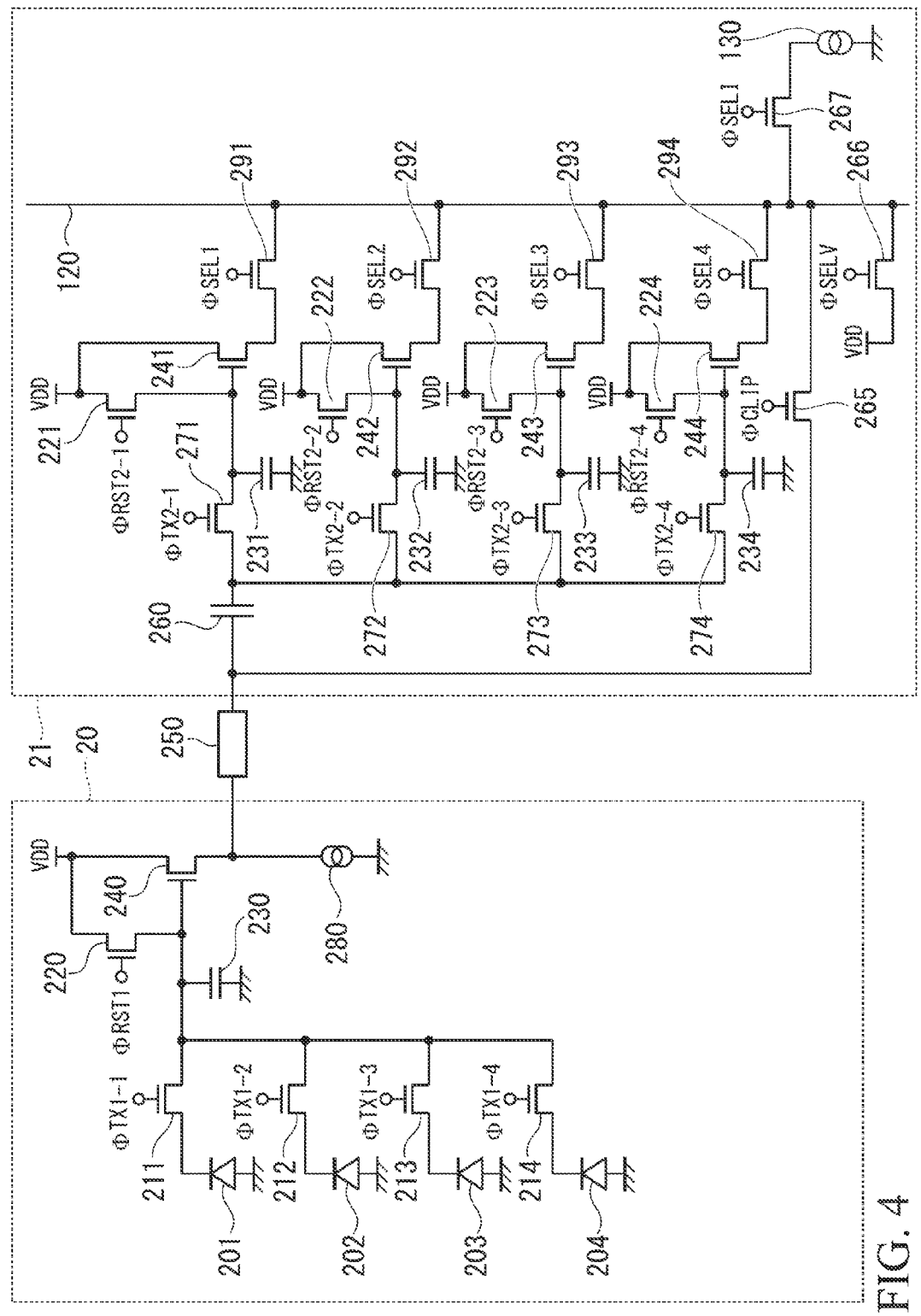
FIG. 4 is a circuit diagram illustrating a circuit configuration of pixels provided in the solid-state image-capturing device according to the first embodiment of the present invention.

FIG. 4 illustrates a circuit configuration of a pixel cell including four pixels 100. In this embodiment, an example in which some circuit elements are shared by the four pixels arranged in a vertical direction will be described. The pixel cell including four pixels 100 includes photoelectric conversion elements 201, 202, 203, and 204, first transfer transistors 211, 212, 213, and 214, a charge holding unit 230 (floating diffusion), a first reset transistor 220, a first amplification transistor 240, a current source 280, a clamp capacitor 260, second transfer transistors 271, 272, 273, and 274, second reset transistors 221, 222, 223, and 224, analog memories 231, 232, 233, and 234 (storage circuits), second amplification transistors 241, 242, 243, and 244, and selection transistors 291, 292, 293, and 294 (output circuits). In addition, a clip transistor 265 is provided, a voltage output transistor 266 (voltage output circuit) and a switch transistor 267 (switch) are connected to the vertical signal line 120, and the current source 130 (second current source) is connected to the switch transistor 267. An arrangement position of each circuit element illustrated in FIG. 4 does not necessarily match an actual arrangement position.

The circuit elements of the four pixels 100 are included in the pixel cell. The first pixel includes the photoelectric conversion element 201, the first transfer transistor 211, the charge holding unit 230, the first reset transistor 220, the first amplification transistor 240, the current source 280 (first current source), the clamp capacitor 260, the second transfer transistor 271, the second reset transistor 221, the analog memory 231, the second amplification transistor 241, and the selection transistor 291. The second pixel includes the photoelectric conversion element 202, the first transfer transistor 212, the charge holding unit 230, the first reset transistor 220, the first amplification transistor 240, the current source 280, the clamp capacitor 260, the second transfer transistor 272, the second reset transistor 222, the analog memory 232, the second amplification transistor 242, and the selection transistor 292.

The third pixel includes the photoelectric conversion element 203, the first transfer transistor 213, the charge holding unit 230, the first reset transistor 220, the first amplification transistor 240, the current source 280, the clamp capacitor 260, the second transfer transistor 273, the second reset transistor 223, the analog memory 233, the second amplification transistor 243, and the selection transistor 293. The fourth pixel includes the photoelectric conversion element 204, the first transfer transistor 214, the charge holding unit 230, the first reset transistor 220, the first amplification transistor 240, the current source 280, the clamp capacitor 260, the second transfer transistor 274, the second reset transistor 224, the analog memory 234, the second amplification transistor 244, and the selection transistor 294. The charge holding unit 230, the first reset transistor 220, the first amplification transistor 240, the current source 280, and the clamp capacitor 260 are shared by the four pixels 100.

One ends of the photoelectric conversion elements 201, 202, 203, and 204 are grounded. Drain terminals of the first transfer transistors 211, 212, 213, and 214 are connected to the other ends of the photoelectric conversion elements 201, 202, 203, and 204. Gate terminals of the first transfer transistors 211, 212, 213, and 214 are connected to the vertical scanning circuit 300, and transfer pulses ΦTX1-1, ΦTX1-2, ΦTX1-3, and ΦTX1-4 are supplied to the gate terminals.

One end of the charge holding unit 230 is connected to source terminals of the first transfer transistors 211, 212, 213, and 214, and the other end of the charge holding unit 230 is grounded. A drain terminal of the first reset transistor 220 is connected to a power supply voltage VDD, and a source terminal of the first reset transistor 220 is connected to the source terminals of the first transfer transistors 211, 212, 213, and 214. A gate terminal of the first reset transistor 220 is connected to the vertical scanning circuit 300, and a reset pulse ΦRST1 is supplied to the gate terminal.

A drain terminal of the first amplification transistor 240 is connected to the power supply voltage VDD. A gate terminal that is an input part of the first amplification transistor 240 is connected to the source terminals of the first transfer transistors 211, 212, 213, and 214. One end of the current source 280 is connected to a source terminal of the first amplification transistor 240, and the other end of the current source 280 is grounded. For example, the current source 280 may include a transistor having a drain terminal connected to the source terminal of the first amplification transistor 240, a grounded source terminal, and a gate terminal connected to the vertical scanning circuit 300. One end of the clamp capacitor 260 is connected to the source terminal of the first amplification transistor 240 and the one end of the current source 280 via the connection unit 250.

Drain terminals of the second transfer transistors 271, 272, 273, and 274 are connected to the other end of the clamp capacitor 260. Gate terminals of the second transfer transistors 271, 272, 273, and 274 are connected to the vertical scanning circuit 300, and transfer pulses ΦTX2-1, ΦTX2-2, ΦTX2-3, and ΦTX2-4 are supplied to the gate terminals. Drain terminals of the second reset transistors 221, 222, 223, and 224 are connected to the power supply voltage VDD, and source terminals of the second reset transistors 221, 222, 223, and 224 are connected to source terminals of the second transfer transistors 271, 272, 273, and 274. Gate terminals of the second reset transistors 221, 222, 223, and 224 are connected to the vertical scanning circuit 300, and reset pulses ΦRST2-1, ΦRST2-2, ΦRST2-3, and ΦRST2-4 are supplied to the gate terminals.

One ends of the analog memories 231, 232, 233, and 234 are connected to the source terminals of the second transfer transistors 271, 272, 273, and 274, and the other ends of the analog memories 231, 232, 233, and 234 are grounded. Drain terminals of the second amplification transistors 241, 242, 243 and 244 are connected to the power supply voltage VDD. Gate terminals constituting input parts of the second amplification transistors 241, 242, 243, and 244 are connected to the source terminals of the second transfer transistors 271, 272, 273, and 274. Drain terminals of the selection transistors 291, 292, 293, and 294 are connected to the source terminals of the second amplification transistors 241, 242, 243, and 244, and source terminals of the selection transistors 291, 292, 293, and 294 are connected to the vertical signal line 120. Gate terminals of the selection transistors 291, 292, 293, and 294 are connected to the vertical scanning circuit 300, and selection pulses ΦSEL1, ΦSEL2, ΦSEL3, and ΦSEL4 are supplied to the gate terminals.

A drain terminal of the clip transistor 265 is connected to the source terminal of the first amplification transistor 240 and the one end of the current source 280 via the connection unit 250 and a source terminal of the clip transistor 265 is connected to the vertical signal line 120. A gate terminal of the clip transistor 265 is connected to the vertical scanning circuit 300 and a control voltage ΦCLIP is supplied to the gate terminal. A drain terminal of the voltage output transistor 266 is connected to the power supply voltage VDD and a source terminal of the voltage output transistor 266 is connected to the vertical signal line 120. A gate terminal of the voltage output transistor 266 is connected to the vertical scanning circuit 300 and a control voltage ΦSELV is supplied to the gate terminal.

A drain terminal of the switch transistor 267 is connected to the vertical signal line 120. A gate terminal of the switch transistor 267 is connected to the vertical scanning circuit 300 and a control voltage ΦSELI is supplied to the gate terminal. The one end of the current source 130 is connected to the source terminal of the switch transistor 267 and the other end of the current source 130 is grounded. For example, the current source 130 may be constituted of a transistor having a drain terminal connected to the source terminal of the switch transistor 267, a grounded source terminal, and a gate terminal connected to the vertical scanning circuit 300. For each transistor described above, a polarity may be reversed and the source terminal and the drain terminal may be the reverse of those described above.

The photoelectric conversion elements 201, 202, 203, and 204 are, for example, photodiodes that generate (produce) signal charges based on incident light and hold and store the generated (produced) signal charges. The first transfer transistors 211, 212, 213, and 214 are transistors which transfer the signal charges stored in the photoelectric conversion elements 201, 202, 203, and 204 to the charge holding unit 230. ON/OFF of the first transfer transistors 211, 212, 213, and 214 is controlled by transfer pulses ΦTX1-1, ΦTX1-2, ΦTX1-3, and ΦTX1-4 from the vertical scanning circuit 300. The charge holding unit 230 is a floating diffusion capacitor which temporarily holds and stores the signal charges transferred from the photoelectric conversion elements 201, 202, 203, and 204.

The first reset transistor 220 is a transistor which resets the charge holding unit 230. ON/OFF of the first reset transistor 220 is controlled by the reset pulse ΦRST1 from the vertical scanning circuit 300. The photoelectric conversion elements 201, 202, 203, and 204 may be reset by simultaneously turning on the first reset transistor 220 and the first transfer transistors 211, 212, 213, and 214. The resetting of the charge holding unit 230/the photoelectric conversion elements 201, 202, 203, and 204 includes controlling an amount of charges stored in the charge holding unit 230/the photoelectric conversion elements 201, 202, 203, and 204 to set states (potentials) of the charge holding unit 230/the photoelectric conversion elements 201, 202, 203, and 204 to a reference state (a reference potential or a reset level).

The first amplification transistor 240 is a transistor that outputs an amplified signal, which is obtained by amplifying a signal based on the signal charges stored in the charge holding unit 230, input to the gate terminal from the source terminal. The current source 280 functions as a load of the first amplification transistor 240 and supplies the first amplification transistor 240 with a current which drives the first amplification transistor 240. The first amplification transistor 240 and the current source 280 constitute a source follower circuit.

The clamp capacitor 260 is a capacitor for clamping (fixing) a voltage level of an amplified signal output from the first amplification transistor 240. The second transfer transistors 271, 272, 273, and 274 are transistors which sample and hold the voltage level of the other end of the clamp capacitor 260 and store signals in the analog memories 231, 232, 233, and 234. ON/OFF of the second transfer transistors 271, 272, 273, and 274 are controlled through transfer pulses ΦTX2-1, ΦTX2-2, ΦTX2-3, and ΦTX2-4 from the vertical scanning circuit 300.

The second reset transistors 221, 222, 223, and 224 are transistors which reset the analog memories 231, 232, 233, and 234. ON/OFF of the second reset transistors 221, 222, 223, and 224 is controlled by reset pulses ΦRST2-1, ΦRST2-2, ΦRST2-3, and ΦRST2-4 from the vertical scanning circuit 300. Resetting of the analog memories 231, 232, 233, and 234 includes controlling amounts of charges stored in the analog memories 231, 232, 233, and 234 to set states (potentials) of the analog memories 231, 232, 233, and 234 to a reference state (a reference potential or a reset level). The analog memories 231, 232, 233, and 234 hold and store the analog signals sampled and held by the second transfer transistors 271, 272, 273, and 274.

Capacitances of the analog memories 231, 232, 233, and 234 are set to be greater than that of the charge holding unit 230. It is more desirable for a metal insulator metal (MIM) capacitor or a metal oxide semiconductor (MOS) capacitor having a small leak current (dark current) per unit area to be used as the analog memories 231, 232, 233, and 234. Thereby, immunity to noise is improved and a high-quality signal is obtained.

The second amplification transistors 241, 242, 243, and 244 are transistors that output amplified signals, which are obtained by amplifying signals based on the signal charges stored in the analog memories 231, 232, 233, and 234, input to the gate terminals, from the source terminals. The second amplification transistors 241, 242, 243, and 244 and the current sources 130 connected to the vertical signal line 120 constitute a source follower circuit. The selection transistors 291, 292, 293, and 294 are transistors which select the pixels 100 and send outputs of the second amplification transistors 241, 242, 243, and 244 to the vertical signal line 120. ON/OFF of the selection transistors 291, 292, 293, and 294 is controlled by the selection pulses ΦSEL1, ΦSEL2, ΦSEL3, and ΦSEL4 from the vertical scanning circuit 300.

The clip transistor 265 is a transistor which fixes a voltage of the drain terminal according to a predetermined clip voltage input to the gate terminal when the charge holding unit 230 connected to the gate terminal of the first amplification transistor 240 has been reset. The state of the clip transistor 265 is controlled by the control voltage ΦCLIP from the vertical scanning circuit 300. The clip transistor 265 and the current source 280 constitute a source follower circuit. The voltage output transistor 266 is a transistor which outputs the power supply voltage VDD to the vertical signal line 120 when the charge holding unit 230 has been reset. The state of the voltage output transistor 266 is controlled by the control voltage ΦSELV from the vertical scanning circuit 300.

The switch transistor 267 is a transistor which switches ON and OFF of a connection between the vertical signal line 120 and the current source 130. The switch transistor 267 is turned off when the charge holding unit 230 has been reset and the current source 130 is disconnected from the vertical signal line 120. The state of the switch transistor 267 is controlled by the control signal ΦSELI from the vertical scanning circuit 300.

Among the circuit elements illustrated in FIG. 4, the photoelectric conversion elements 201, 202, 203 and 204, the first transfer transistors 211, 212, 213 and 214, the charge holding unit 230, the first reset transistor 220, the first amplification transistor 240, and the current source 280 are arranged in the first substrate 20. In addition, the clamp capacitor 260, the second transfer transistors 271, 272, 273, and 274, the second reset transistors 221, 222, 223, and 224, the analog memories 231, 232, 233, and 234, the second amplification transistors 241, 242, 243, and 244, the selection transistors 291, 292, 293, and 294, the clip transistor 265, the voltage output transistor 266, and the switch transistor 267 are arranged in the second substrate 21.

The connection unit 250 is arranged between the first substrate 20 and the second substrate 21. The amplified signal output from the first amplification transistor 240 in the first substrate 20 is output to the second substrate 21 via the connection unit 250.

In FIG. 4, the connection unit 250 is arranged in a path among the source terminal of the first amplification transistor 240, the one end of the current source 280, and the one end of the clamp capacitor 260, but the present invention is not limited thereto. The connection unit 250 may be arranged on a path electrically connected from the first transfer transistors 211, 212, 213, and 214 to the second transfer transistors 271, 272, 273, and 274.

For example, the connection unit 250 may be arranged on a path among the source terminals of the first transfer transistors 211, 212, 213, and 214, the one end of the charge holding unit 230, the source terminal of the first reset transistor 220, and the gate terminal of the first amplification transistor 240. Alternatively, the connection unit 250 may be arranged on a path among the other end of the clamp capacitor 260 and the drain terminals of the second transfer transistors 271, 272, 273, and 274.

Although the current source 280 is arranged in the first substrate 20 in FIG. 4, the current source 280 may be arranged in the second substrate 21 and one end of the current source 280 may be connected to one end of the clamp capacitor 260. Although the clip transistor 265 is arranged in the second substrate 21 in FIG. 4, the clip transistor 265 may be arranged in the first substrate 20 and connected to the vertical signal line 120 of the second substrate 21 via the connection unit. Although the voltage output transistor 266 is arranged in the second substrate 21 in FIG. 4, the voltage output transistor 266 may be arranged in the first substrate 20 and connected to the vertical signal line 120 of the second substrate 21 via the connection unit. Although the switch transistor 267 and the current source 130 are arranged in the second substrate 21 in FIG. 4, the switch transistor 267 and the current source 130 may be arranged in the first substrate 20 and the switch transistor 267 may be connected to the vertical signal line 120 of the second substrate 21 via the connection unit.

Figure 5:
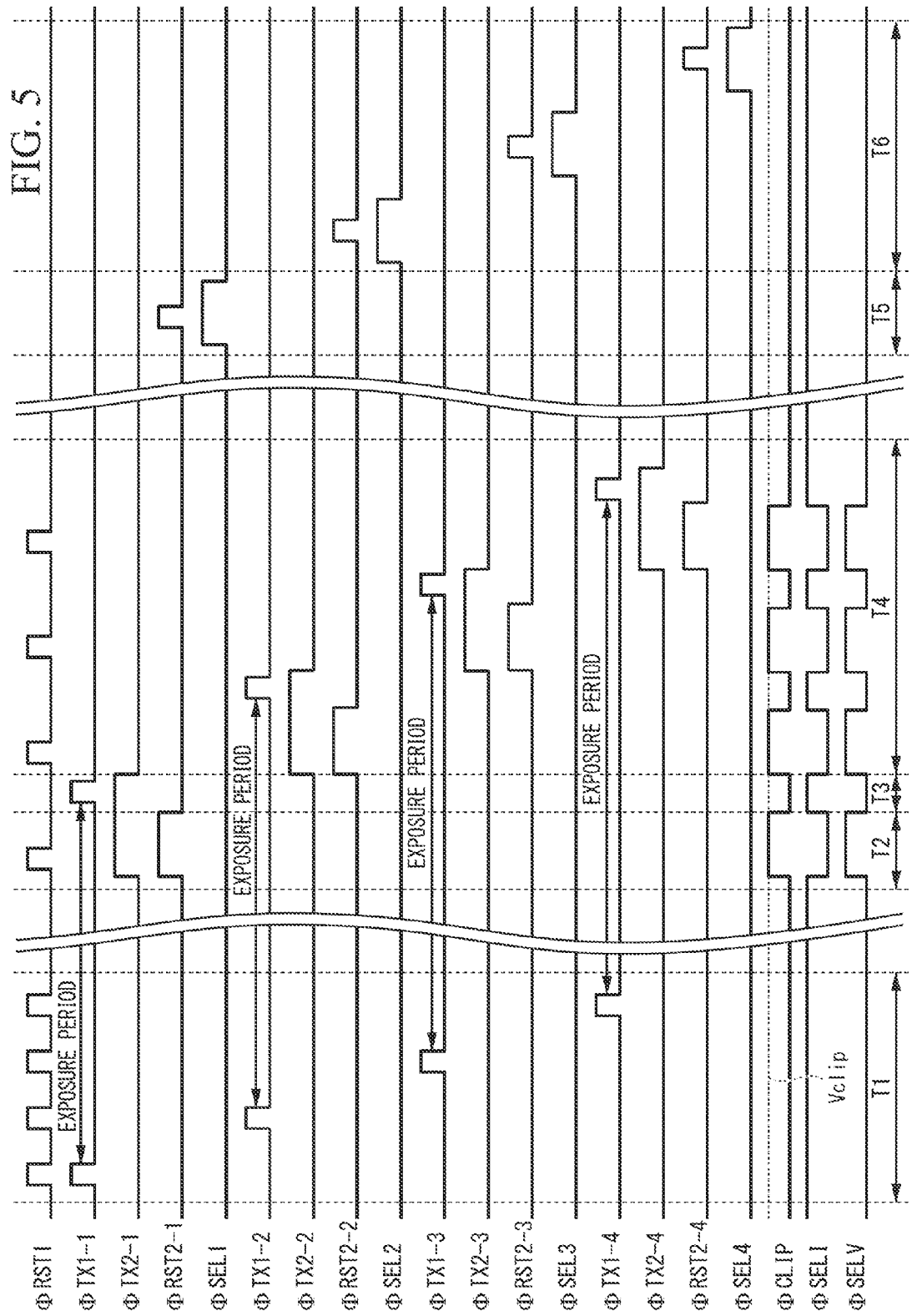
FIG. 5 is a timing chart illustrating an operation of the solid-state image-capturing device according to the first embodiment of the present invention.

Next, an operation of the solid-state image-capturing device 3 will be described with reference to FIG. 5. FIG. 5 illustrates a control signal and the like to be supplied from the vertical scanning circuit 300 to the pixel 100 for every row. Hereinafter, an operation in a unit of a pixel cell constituted of four pixels illustrated in FIG. 4 will be described.

Operation in Period T1

First, the reset pulse ΦRST1 changes from an "L" (Low) level to an "H" (High) level, so that the first reset transistor 220 is turned on. Simultaneously, the transfer pulse ΦTX1-1 changes from the "L" level to the "H" level, so that the first transfer transistor 211 is turned on. Thereby, the photoelectric conversion element 201 of the first pixel is reset.

Subsequently, the reset pulse ΦRST1 and the transfer pulse ΦTX1-1 change from the "H" level to the "L" level, so that the first reset transistor 220 and the first transfer transistor 211 are turned off. Thereby, the resetting of the photoelectric conversion element 201 of the first pixel ends, and the exposure of the first pixel (storage of signal charges) starts. As described above, the photoelectric conversion element 202 of the second pixel, the photoelectric conversion element 203 of the third pixel, and the photoelectric conversion element 204 of the fourth pixel are reset in order, and the exposure of each pixel starts. In FIG. 4, the reset pulse ΦRST1 changes to the "H" level at the timing at which the transfer pulses ΦTX1-1, ΦTX1-2, ΦTX1-3, and ΦTX1-4 change to the "H" level. However, the reset pulse ΦRST1 may constantly be at the "H" level during a period in which the photoelectric conversion elements 201, 202, 203, and 204 are reset.

Operation in Period T2

Subsequently, the reset pulse ΦRST2-1 changes from the "L" level to the "H" level, so that the second reset transistor 221 is turned on. Thereby, the analog memory 231 is reset. Simultaneously, the transfer pulse ΦTX2-1 changes from the "L" level to the "H" level, so that the second transfer transistor 271 is turned on. Thereby, a potential of the other end of the clamp capacitor 260 is reset to the power supply voltage VDD and the second transfer transistor 271 starts sampling and holding of the potential of the other end of the clamp capacitor 260.

The control voltage ΦCLIP changes from the "L" level to the clip voltage Vclip simultaneously when the reset pulse ΦRST2-1 and the transfer pulse ΦTX2-1 change from the "L" level to the "H" level, so that the clip transistor 265 fixes the voltage of the drain terminal. The clip voltage Vclip is greater than or equal to an allowed value as a minimum value of the reset level and is a set value which does not exceed the power supply voltage VDD.

The control voltage ΦSELI changes from the "H" level to the "L" level simultaneously when the control voltage ΦCLIP changes from the "L" level to the clip voltage Vclip, so that the switch transistor 267 is turned off. Thereby, the current source 130 is disconnected from the vertical signal line 120. Simultaneously, the control voltage ΦSELV changes from the "L" level to the "H" level, so that the voltage output transistor 266 is turned on. Thereby, the power supply voltage VDD is output to the vertical signal line 120.

Subsequently, the reset pulse ΦRSTI changes from the "L" level to the "H" level, so that the first reset transistor 220 is turned on. Thereby, the charge holding unit 230 is reset. Subsequently, the reset pulse ΦRST1 changes from the "H" level to the "L" level, so that the first reset transistor 220 is turned off. Thereby, the resetting of the charge holding unit 230 ends. It is only necessary for the timing at which the charge holding unit 230 is reset to be in an exposure period. However, the charge holding unit 230 is reset at the timing immediately before the exposure period ends, so that it is possible to further reduce noise due to a leak current of the charge holding unit 230.

Figure 6:
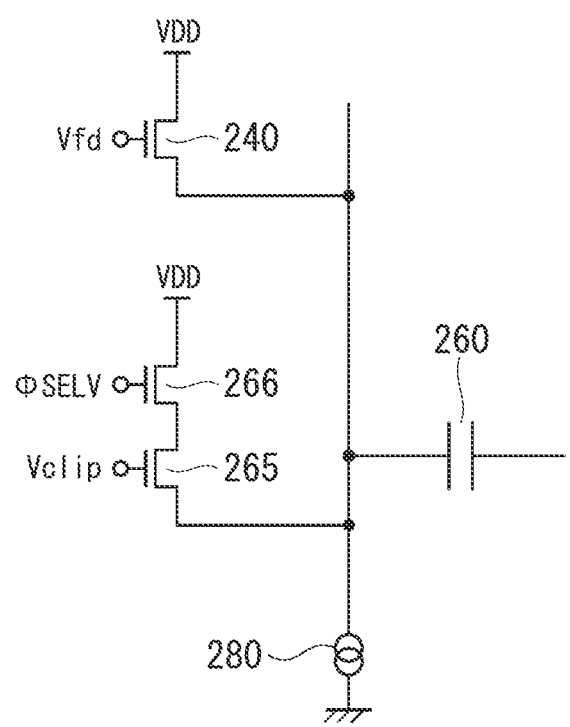
FIG. 6 is a circuit diagram illustrating a partial circuit configuration provided in the solid-state image-capturing device according to the first embodiment of the present invention.

FIG. 6 is a diagram obtained by extracting only the first amplification transistor 240, the clip transistor 265, the voltage output transistor 266, the current source 280, and the clamp capacitor 260 from the configuration illustrated in FIG. 4. In FIG. 6, the connection unit 250 is omitted. Because the first amplification transistor 240 and the current source 280 constitute a source follower circuit, the first amplification transistor 240 outputs substantially the same voltage as the potential Vfd of one end of the charge holding unit 230 input to the gate terminal from the source terminal. In addition, because the clip transistor 265 and the current source 280 constitute the source follower circuit when the voltage output transistor 266 is turned on, the clip transistor 265 outputs substantially the same voltage as the clip voltage Vclip input to the gate terminal from the source terminal.

When strong light has been incident during the resetting of the charge holding unit 230, the potential Vfd of the one end of the charge holding unit 230 decreases due to signal charges generated by the light and the voltage output from the source terminal of the first amplification transistor 240 decreases as the reset level. However, because the voltage output from the source terminal of the clip transistor 265 is fixed to substantially the same voltage as the clip voltage Vclip greater than or equal to an allowed value serving as a minimum value of the reset level, the potential of the one end of the clamp capacitor 260 is not less than the voltage. Thereby, it is possible to suppress the occurrence of a blackening phenomenon.

Subsequently, the reset pulse ΦRST2-1 changes from the "H" level to the "L" level, so that the second reset transistor 221 is turned off. Thereby, the resetting of the analog memory 231 ends. At this time point, the clamp capacitor 260 clamps the amplified signal output from the first amplification transistor 240 (the amplified signal after the resetting of the charge holding unit 230).

The control voltage ΦCLIP changes from the clip voltage Vclip to the "L" level simultaneously when the reset pulse ΦRST2-1 changes from the "H" level to the "L" level, so that the clip transistor 265 releases the fixation of the voltage of the drain terminal. Simultaneously, the control voltage ΦSELI changes from the "L" level to the "H" level, so that the switch transistor 267 is turned on. Thereby, the current source 130 is connected to the vertical signal line 120. Simultaneously, the control voltage ΦSELV changes from the "H" level to the "L" level, so that the voltage output transistor 266 is turned off. Thereby, the output of the power supply voltage VDD to the vertical signal line 120 stops.

Operation in Period T3

First, the transfer pulse ΦTX1-1 changes from the "L" level to the "H" level, so that the first transfer transistor 211 is turned on. Thereby, the signal charges stored in the photoelectric conversion element 201 are transferred to the charge holding unit 230 via the first transfer transistor 211, and stored in the charge holding unit 230. Thereby, the exposure of the first pixel (the storage of the signal charges) ends. A period from an exposure start of the first pixel in Period T1 to an exposure end of the first pixel in Period T3 is the exposure period (signal storage period). Subsequently, the transfer pulse ΦTX1-1 changes from the "H" level to the "L" level, so that the first transfer transistor 211 is turned off.

Subsequently, the transfer pulse ΦTX2-1 changes from the "H" level to the "L" level, so that the second transfer transistor 271 is turned off. Thereby, the second transfer transistor 271 ends sampling and holding of the potential of the other end of the clamp capacitor 260.

Operation in Period T4

The operations in Periods T2 and T3 described above are operations of the first pixel. In Period T4, the same operations as those in Periods T2 and T3 are performed on each of the second pixel, the third pixel, and the fourth pixel. It is more desirable for lengths of the exposure periods of the pixels to be the same.

Hereinafter, a change in the potential of the one end of the analog memory 231 will be described. This is also similar to changes in potentials of one ends of the analog memories 232, 233, and 234. When a change in the potential of the one end of the charge holding unit 230 due to the transfer of the signal charges from the photoelectric conversion element 201 to the charge holding unit 230 after the resetting of the charge holding unit 230 ends is assumed to be ΔVfd, and a gain of the first amplification transistor 240 is assumed to be α1, a change ΔVamp1 in a potential of the source terminal of the first amplification transistor 240 due to the transfer of the signal charges from the photoelectric conversion element 201 to the charge holding unit 230 is α1×ΔVfd.

When a total gain of the analog memory 231 and the second transfer transistor 271 is assumed to be α2, a change ΔVmem in the potential of the one end of the analog memory 231 due to sampling and holding of the second transfer transistor 271 after the signal charges are transferred from the photoelectric conversion element 201 to the charge holding unit 230 is α2×ΔVamp1, i.e., α1×α2×ΔVfd. ΔVfd may be a change amount of a potential of the one end of the charge holding unit 230 due to a transfer of signal charges and does not include reset noise caused by resetting the charge holding unit 230. Therefore, the second transfer transistor 271 performs sampling and holding, thereby reducing an influence of noise occurring in the photoelectric conversion element 201.

Because the potential of the one end of the analog memory 231 at a point in time at which the resetting of the analog memory 231 has ended is the power supply voltage VDD, the potential Vmem of the one end of the analog memory 231 sampled and held by the second transfer transistor 271 after the signal charges are transferred from the photoelectric conversion element 201 to the charge holding unit 230 is represented by the following Equation (1). In Equation (1), ΔVmem<0 and ΔVfd<0.

$$Vmem = VDD + \Delta Vmem \quad (1)$$
$$= VDD + \alpha1 \times \alpha2 \times \Delta Vfd$$

Further, α2 is represented by the following Equation (2). In Equation (2), CL denotes a capacitance value of the clamp capacitor 260 and CSH denotes a capacitance value of the analog memory 231. In order to reduce degradation of the gain, it is more desirable for the capacitance value CL of the clamp capacitor 260 to be greater than the capacitance value CSH of the analog memory 231.

$$\alpha2 = \frac{CL}{CL + CSH} \quad (2)$$

Operation in Period T5

In Period T5, signals based on the signal charges stored in the analog memories 231, 232, 233, and 234 are sequentially read for every row. First, reading of the signal from the first pixel is performed. The selection pulse ΦSET1 changes from the "L" level to the "H" level, so that the selection transistor 291 is turned on. Thereby, the signal based on the potential Vmem shown in Equation (1) is output to the vertical signal line 120 via the selection transistor 291.

Subsequently, the reset pulse ΦRST2-1 changes from the "L" level to the "H" level, so that the second reset transistor 221 is turned on. Thereby, the analog memory 231 is reset and the signal based on the potential of the one end of the analog memory 231 at the time of resetting is output to the vertical signal line 120 via the selection transistor 291.

Subsequently, the reset pulse ΦRST2-1 is changed from the "H" level to the "L" level, so that the second reset transistor 221 is turned off. The selection pulse ΦSET1 is then changed from the "H" level to the "L" level, so that the selection transistor 291 is turned off.

The column processing circuit 350 generates a difference signal having a difference between the signal based on the potential Vmem shown in Equation (1) and the signal based on the potential of the one end of the analog memory 231 when the analog memory 231 is reset. This difference signal is a signal based on a difference between the potential Vmem shown in Equation (1) and the power supply voltage VDD. The difference signal is a signal based on a difference ΔVfd between the potential of the one end of the charge holding unit 230 immediately after the signal charges stored in the photoelectric conversion element 201 are transferred to the charge holding unit 230 and the potential of the charge holding unit 230 immediately after the one end of the charge holding unit 230 is reset. Accordingly, it is possible to obtain a signal component based on the signal charges stored in the photoelectric conversion element 201 in which a noise component due to the resetting of the analog memory 231 and a noise component due to the resetting of the charge holding unit 230 are suppressed.

The signal output from the column processing circuit 350 is output to the output amplifier 410 by the horizontal scanning circuit 400. The output amplifier 410 processes the signal output from the horizontal scanning circuit 400 and outputs the processed signal as an image signal. Then, reading of the signal from the first pixel ends.

Operation in Period T6

Subsequently, the same operation performed on the first pixel in Period T5 is performed on each of the second, third, and fourth pixels.

In the above-described operation, the charge holding unit 230 should hold the signal charges transferred from the photoelectric conversion elements 201, 202, 203 and 204 to the charge holding unit 230 until the reading timing of each pixel 100. If noise occurs during a period in which the charge holding unit 230 holds the signal charges, the noise is superimposed on the signal charges held by the charge holding unit 230 and signal quality (S/N) is deteriorated.

The noise occurring during the period (hereinafter referred to as a holding period) in which the charge holding unit 230 holds the signal charges is mainly caused by charges (hereinafter referred to as leak charges) due to a leak current of the charge holding unit 230 and charges (hereinafter referred to as light charges) due to light incident on parts other than the photoelectric conversion elements 201, 202, 203 and 204. Assuming that the leak charges and the light charges generated in a unit time are qid and qpn, respectively, and a length of the holding period is tc, noise charges Qn generated during the holding period are (qid+qpn)tc.

It is assumed that capacitance of the charge holding unit 230 is Cfd, capacitances of the analog memories 231, 232, 233, and 234 are Cmem, and a ratio of Cfd and Cmem (Cmem/Cfd) is A. As described above, it is also assumed that the gain of the first amplification transistor 240 is $\alpha 1$ and the total gain of the analog memories 231, 232, 233, and 234 and the second transfer transistors 271, 272, 273, and 274 is $\alpha 2$. Assuming that the signal charges generated in the photoelectric conversion elements 201, 202, 203 and 204 during the exposure period are Qph, signal charges held in the analog memories 231, 232, 233, and 234 after the exposure period ends are $A \times \alpha 1 \times \alpha 2 \times Qph$.

The signal based on the signal charges transferred from the photoelectric conversion elements 201, 202, 203, and 204 to the charge holding unit 230 is sampled and held by the second transfer transistors 271, 272, 273, and 274 and stored in the analog memories 231, 232, 233, and 234. Accordingly, a period of time from the transfer of the signal charges to the charge holding unit 230 to the storage of the signal charges in the analog memories 231, 232, 233, and 234 is short and the noise generated in the charge holding unit 230 is negligible. If the noise occurring in the period in which the analog memories 231, 232, 233, and 234 hold the signal charges is assumed to be the same Qn as described above, an S/N is $A \times \alpha 1 \times \alpha 2 \times Qph/Qn$.

On the other hand, an S/N when signal charges held in a capacitor storage unit are read from a pixel via an amplification transistor is Qph/Qn as in the conventional technology. Accordingly, the S/N of this embodiment is $A \times \alpha 1 \times \alpha 2$ times the S/N of the conventional technology. It is possible to reduce the deterioration of signal quality by setting capacitance values of the analog memories 231, 232, 233, and 234 so that $A \times \alpha 1 \times \alpha 2$ is greater than 1 (for example, by setting the capacitance values of the analog memories 231, 232, 233, and 234 to values sufficiently greater than that of the charge holding unit 230).

Figure 7:
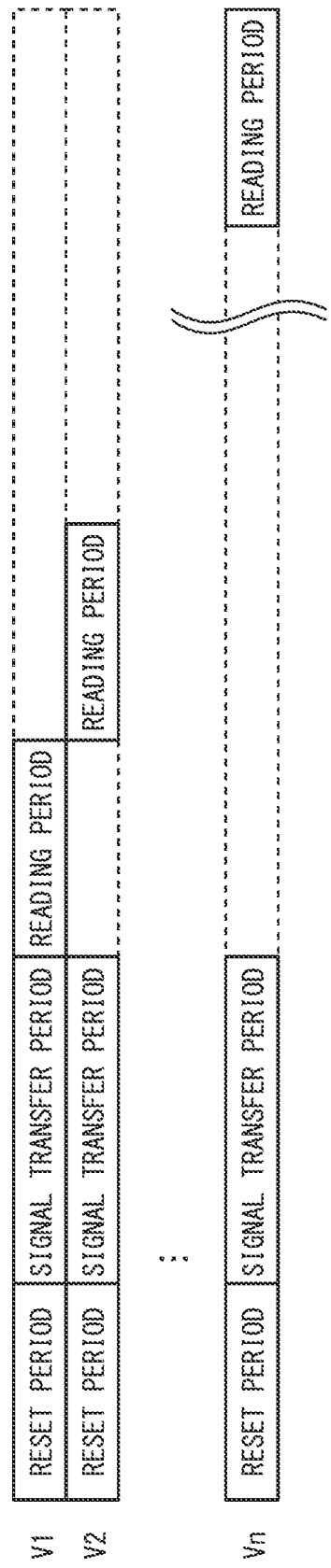
FIG. 7 is a timing chart illustrating operations of the pixels provided in the solid-state image-capturing device according to the first embodiment of the present invention.

In this embodiment, the timings of operations of pixel cells whose positions in the vertical direction (hereinafter described as vertical positions) are the same are the same, but the timings of operations of pixel cells whose vertical positions are different are different. FIG. 7 schematically illustrates the timings of the operations of pixel cells whose vertical positions (V1, V2, . . . , Vn) are different. In FIG. 7, a position in the vertical direction indicates a vertical position in the array of pixel cells, and a position in the horizontal direction indicates a time position.

A reset period corresponds to Period T1 in FIG. 5, a signal transfer period corresponds to Periods T2, T3, and T4 in FIG. 5, and a reading period corresponds to Periods T5 and T6 in FIG. 5. As illustrated in FIG. 7, in the pixel cells whose vertical positions are different, the reset periods and the signal transfer periods are the same. On the other hand, in the pixel cells whose vertical positions are different, the reading periods are different. In the above-described operation, exposure timings are different among the pixels within the same pixel cell, but simultaneity of the exposure can be implemented in the entire pixel cell.

As described above, according to this embodiment, it is possible to reduce the occurrence of a blackening phenomenon because the clip transistor 265 and the current source 280 constitute a source follower circuit and the clip voltage Vclip is input to the gate terminal of the clip transistor 265 when the charge holding unit 230 connected to the gate terminal of the first amplification transistor 240 is reset and therefore the reset level is fixed.

In the solid-state image-capturing device 3 according to this embodiment, clip transistors 265 equal in number to first amplification transistors 240 are necessary because a source follower circuit constituted of the clip transistor 265 and the current source 280 is provided to form a pair with a source follower circuit constituted of the first amplification transistor 240 and the current source 280. Therefore, the clip transistor 265 is necessary for every pixel when each pixel is independent and the clip transistor 265 is necessary for every pixel cell when a pixel cell is constituted of a plurality of pixels. In addition, the voltage output transistor 266 and the switch transistor 267 are necessary for every vertical signal line 120.

In the solid-state image-capturing device disclosed in Patent Literature 2, two transistors including a transistor for fixing the reset level and a transistor for controlling validity/invalidity of the function of the transistor constitute a clip circuit. Therefore, two transistors are necessary for every pixel when each pixel is independent and two transistors are necessary for every pixel cell when a pixel cell is constituted of a plurality of pixels.

As an example in which the pixel cell is constituted of the plurality of pixels, the number of transistors necessary to fix the reset level is compared. In the solid-state image-capturing device disclosed in Patent Literature 2, the number of necessary transistors per column is twice the number of pixel cells. For this, in the solid-state image-capturing device 3 according to this embodiment, transistors (clip transistors 265) equal in number to pixel cells per column and two transistors (a voltage output transistor 266 and a switch transistor 267) are necessary. Therefore, according to this embodiment, it is possible to suppress an increase in the number of elements.

Because some circuit elements are shared among a plurality of pixels in this embodiment, it is possible to reduce a chip area as compared with when no circuit element is shared among the plurality of pixels. Further, it is possible to suppress the number of current sources operating simultaneously because the first amplification transistor 240 and the current source 280 are shared among the plurality of pixels. Thus, it is possible to reduce the occurrence of a voltage drop of the power supply voltage, an increase in a ground (GND) voltage, or the like when a large number of current sources simultaneously operate.

In addition, sensitivity is improved because it is possible to increase an area of photoelectric conversion elements of the first substrate 20 as compared with when all circuit elements of pixels are arranged in one substrate. Further, it is possible to reduce an area of a signal storage region provided in the second substrate 21 by using an analog memory.

In addition, the analog memories 231, 232, 233, and 234 are provided, so that it is possible to reduce the deterioration of signal quality. In particular, a capacitance value of the analog memory is greater than that of the charge holding unit (for example, the capacitance value of the analog memory is greater than or equal to a value five times the capacitance value of the charge holding unit), so that an amount of signal charges held by the analog memory is greater than an amount of signal charges held by the charge holding unit. Thus, it is possible to reduce an influence of signal deterioration due to a leak current of the analog memory.

In addition, the clamp capacitor 260 and the second transfer transistors 271, 272, 273, and 274 are provided, so that it is possible to reduce the influence of noise occurring in the first substrate 20. As the noise occurring in the first substrate 20, there is noise (for example, reset noise) occurring in an input part of the first amplification transistor 240 derived from an operation of a circuit (for example, the first reset transistor 220) connected to the first amplification transistor 240, noise (for example, noise due to variation in a circuit threshold value of the first amplification transistor 240) derived from operation characteristics of the first amplification transistor 240, or the like.

In addition, a signal when the analog memories 231, 232, 233, and 234 are reset and a signal according to fluctuation of an output of the first amplification transistor 240 occurring due to the transfer of signal charges from the photoelectric conversion elements 201, 202, 203, and 204 to the charge holding unit 230 are output from the pixels 100 in time division and difference processing of each signal is performed outside the pixel 100, so that it is possible to reduce an influence of noise occurring in the second substrate 21. As noise occurring in the second substrate 21, there is noise (for example, reset noise) occurring in the input parts of the second amplification transistors 241, 242, 243, and 244 derived from the operation of a circuit (for example, the second reset transistors 221, 222, 223, and 224) connected to the second amplification transistors 241, 242, 243, and 244 or the like.

Second Embodiment

Figure 8:
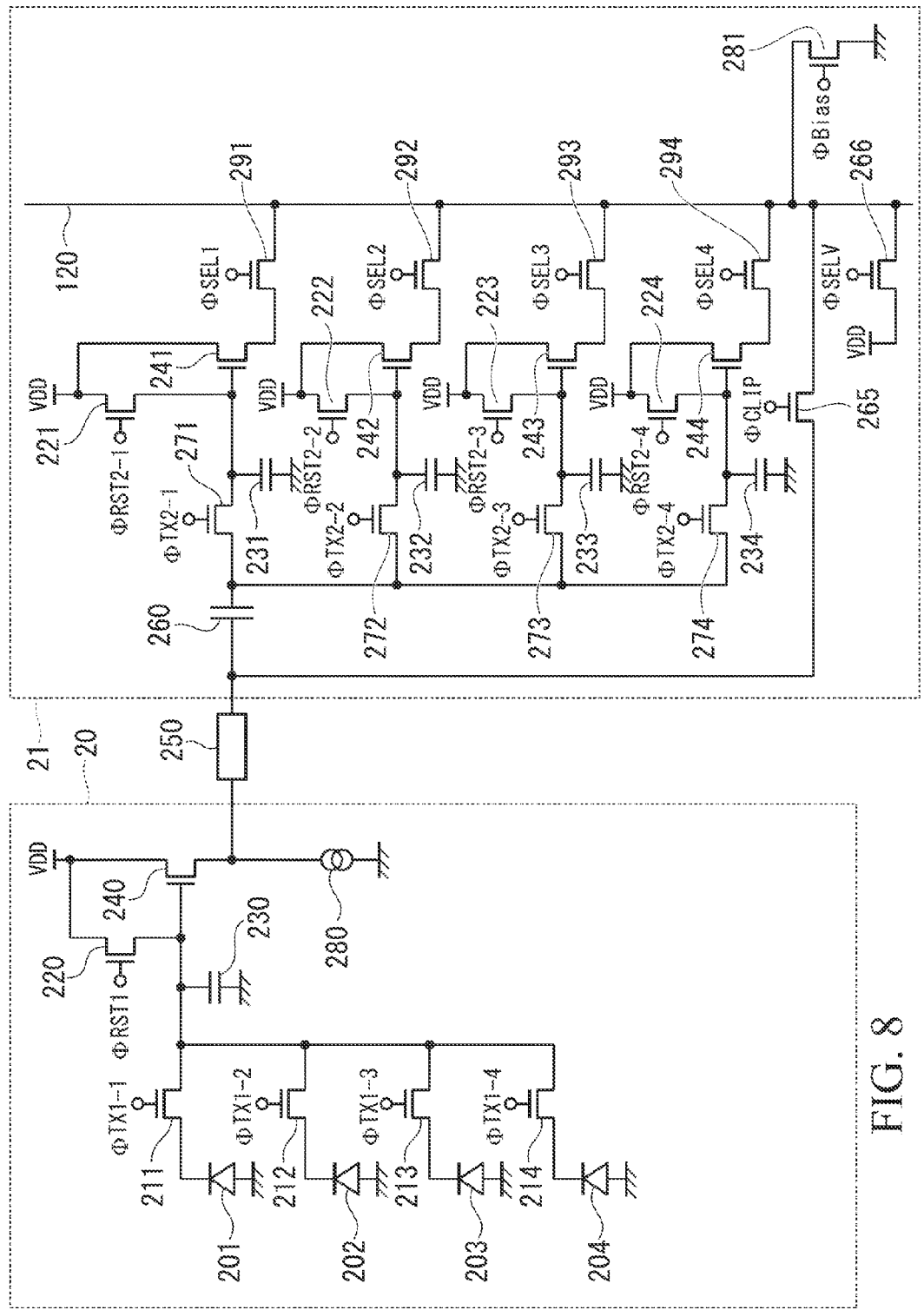
FIG. 8 is a circuit diagram illustrating a circuit configuration of pixels provided in a solid-state image-capturing device according to a second embodiment of the present invention.

Next, the second embodiment of the present invention will be described. FIG. 8 illustrates a circuit configuration of a pixel cell in this embodiment. FIG. 8 is different from FIG. 4 in that a current source 281 in which ON/OFF is switchable is provided in place of the switch transistor 267 and the current source 130. The current source 281 is constituted of a transistor having a drain terminal connected to a vertical signal line 120, a grounded source terminal, and a gate terminal connected to a vertical scanning circuit 300. ON/OFF of the current source 281 is controlled by a control pulse ΦBias from the vertical scanning circuit 300. In terms of the current source 281, a polarity may be reversed and the source terminal and the drain terminal may be the reverse of those described above. Other components are similar to those illustrated in FIG. 4.

The operation of the solid-state image-capturing device 3 according to this embodiment is similar to that illustrated in FIG. 5 except that the current source 281 is turned on in the same period as a period in which a control signal ΦSELI is at the "H" level and the current source 281 is turned off in the same period as a period in which the control signal ΦSELI is at the "L" level in FIG. 5.

Therefore, according to this embodiment, as in the first embodiment, it is possible to reduce the occurrence of a blackening phenomenon while suppressing an increase in the number of elements. In addition, it is possible to reduce the number of elements more than in the first embodiment.

Third Embodiment

Figure 9:
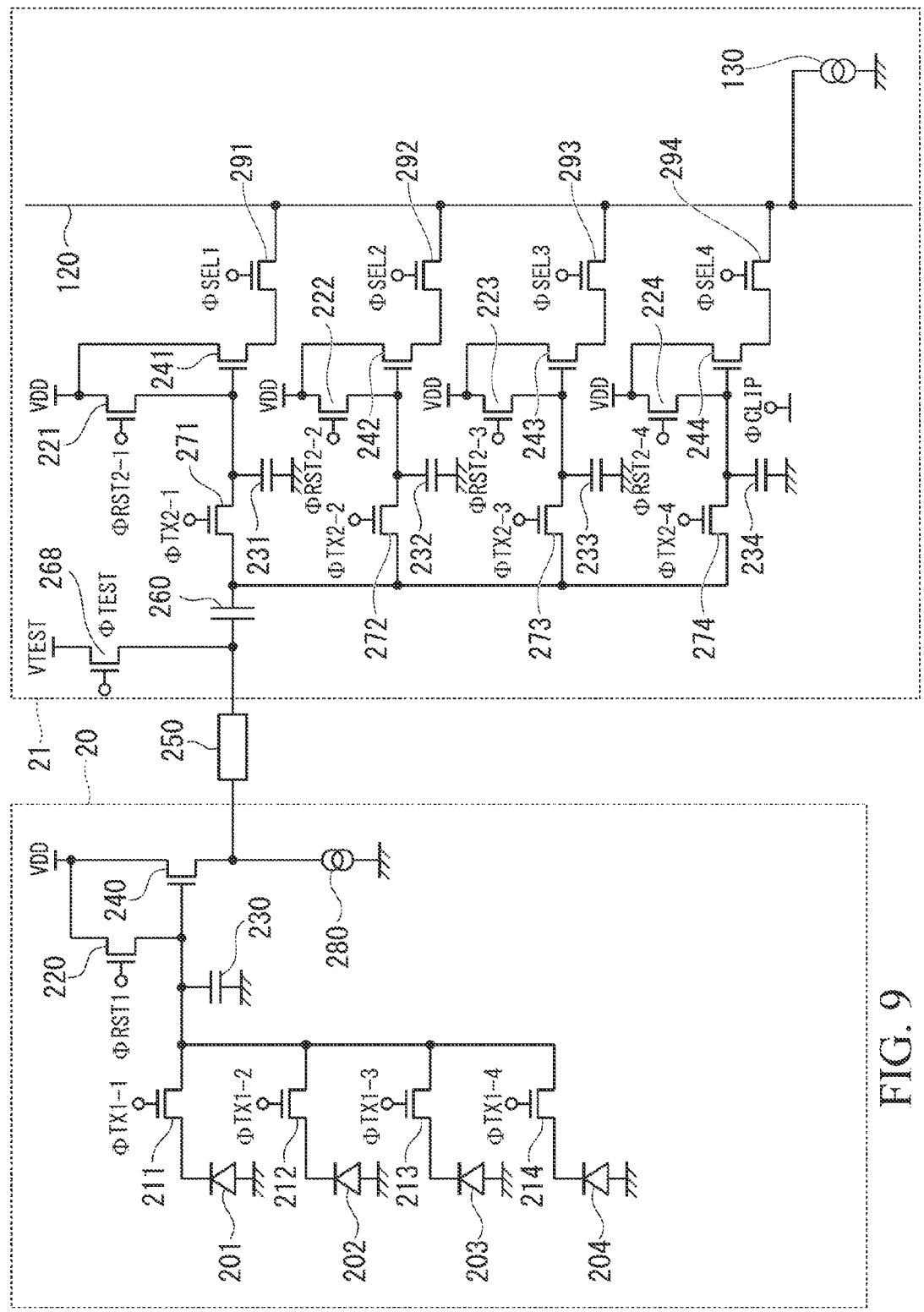
FIG. 9 is a circuit diagram illustrating a circuit configuration of pixels provided in a solid-state image-capturing device according to a third embodiment of the present invention.

Next, the third embodiment of the present invention will be described. FIG. 9 illustrates a circuit configuration of a pixel cell in this embodiment. Differences from FIG. 4 will be described. In FIG. 9, the clip transistor 265, the voltage output transistor 266, and the switch transistor 267 are not provided, and a test transistor 268 is provided. A drain terminal of the test transistor 268 is connected to a test voltage VTEST and a source terminal of the test transistor 268 is connected to a source terminal of a first amplification transistor 240 and one end of a current source 280 via a connection unit 250. A gate terminal of the test transistor 268 is connected to a vertical scanning circuit 300 and a control voltage ΦTEST is supplied to the gate terminal.

The test transistor 268, for example, is a transistor for inputting a test voltage for testing an independent function of a second substrate 21 before the first substrate 20 and a second substrate 21 are bonded. During the test, the control voltage ΦTEST of the "H" level is input to a gate terminal of the test transistor 268 and the test transistor 268 is turned on. In addition, during the test, a test voltage VTEST corresponding to a reset level and a test voltage VTEST corresponding to a signal level are input to a drain terminal of the test transistor 268 and a circuit element of the second substrate 21 operates.

On the other hand, during an operation of the pixel 100 after the first substrate 20 and the second substrate 21 are bonded, a clip voltage for fixing a voltage to be output from the source terminal is input to the gate terminal of the test transistor 268. In addition, during the operation of the pixel 100 after the first substrate 20 and the second substrate 21 are bonded, a power supply voltage VDD is input as the test voltage VTEST to the drain terminal of the test transistor 268. At this time, the test transistor 268 and the current source 280 constitute a source follower circuit. In terms of the test transistor 268, a polarity may be reversed and the source terminal and the drain terminal may be the reverse of those described above.

Figure 10:
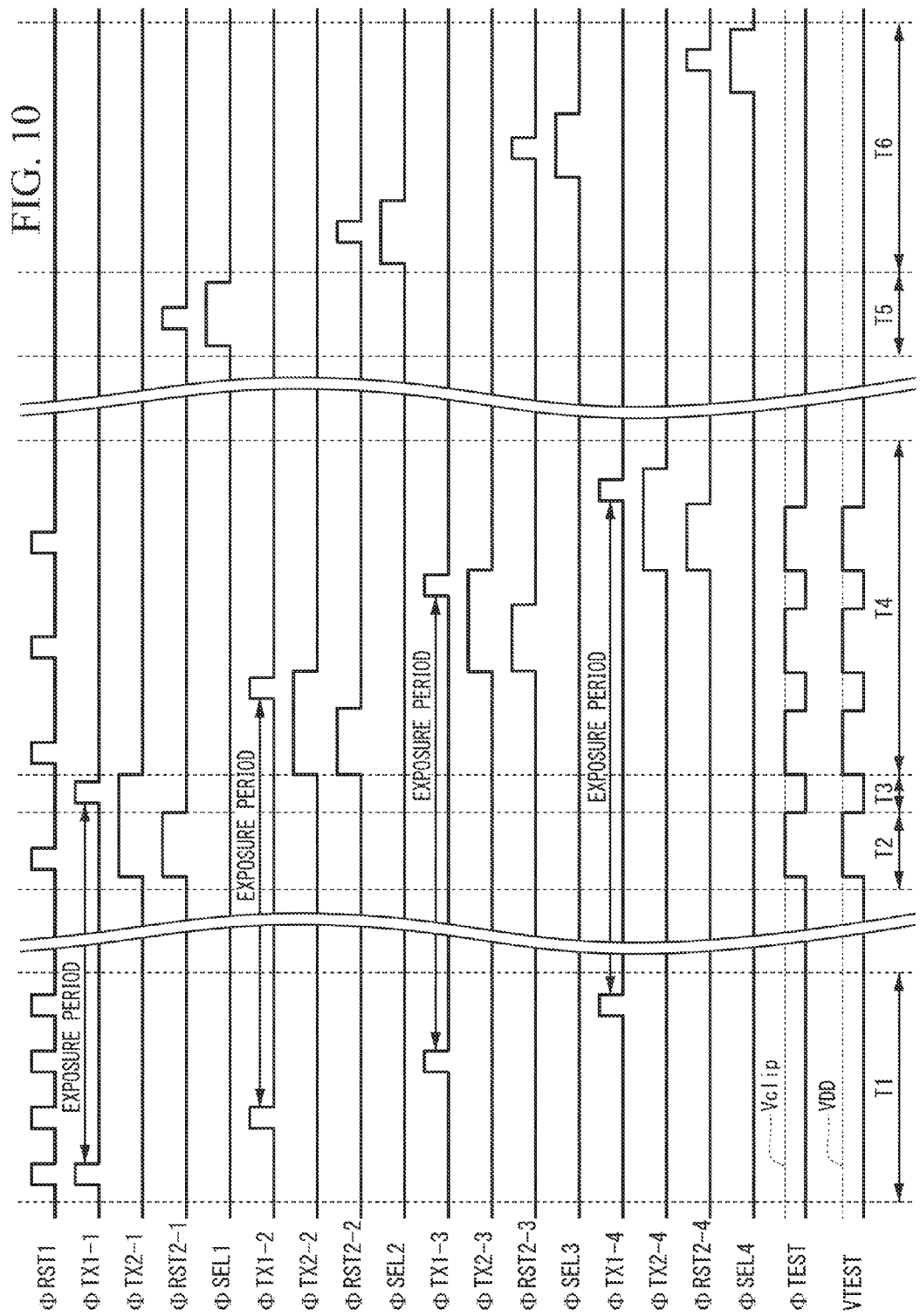
FIG. 10 is a timing chart illustrating an operation of the solid-state image-capturing device according to the third embodiment of the present invention.

Next, an operation of the solid-state image-capturing device 3 will be described with reference to FIG. 10. FIG. 10 illustrates a control signal and the like to be supplied from the vertical scanning circuit 300 to the pixel 100 for every row. Hereinafter, an operation of the test transistor 268 in Period T2 will be described.

In Period T2, the control voltage ΦTEST changes from the "L" level to the clip voltage Vclip simultaneously when a reset pulse ΦRST2-1 and a transfer pulse ΦTX2-1 change from the "L" level to the "H" level. Simultaneously, the test voltage VTEST changes from the "L" level to the power supply voltage VDD. Thereby, the test transistor 268 fixes the voltage of the source terminal. The clip voltage Vclip is greater than or equal to an allowed value as a minimum value of the reset level and is a set value which does not exceed the power supply voltage VDD.

Subsequently, the control voltage ΦTEST changes from the clip voltage Vclip to the "L" level simultaneously when the reset pulse ΦRST2-1 changes from the "H" level to the "L" level. Simultaneously, the test voltage VTEST changes from the power supply voltage VDD to the "L" level. Thereby, the test transistor 268 releases the fixation of the voltage of the source terminal. Operations other than that described above are similar to those described in the first embodiment.

Because the first amplification transistor 240 and the current source 280 constitute a source follower circuit, the first amplification transistor 240 outputs substantially the same voltage as the potential Vfd of one end of the charge holding unit 230 input to the gate terminal from the source terminal. In addition, because the test transistor 268 and the current source 280 constitute the source follower circuit, the test transistor 268 outputs substantially the same voltage as the clip voltage Vclip input to the gate terminal from the source terminal.

When strong light has been incident during the resetting of the charge holding unit 230, the potential Vfd of the one end of the charge holding unit 230 decreases due to signal charges generated by the light and the voltage output from the source terminal of the first amplification transistor 240 decreases as the reset level. However, because the voltage output from the source terminal of the test transistor 268 is fixed to substantially the same voltage as the clip voltage Vclip greater than or equal to an allowed value serving as a minimum value of the reset level, the potential of the one end of the clamp capacitor 260 is not less than the voltage. Thereby, it is possible to suppress the occurrence of a blackening phenomenon.

As described above, according to this embodiment, it is possible to reduce the occurrence of a blackening phenomenon because the test transistor 268 and the current source 280 constitute a source follower circuit and the clip voltage Vclip is input to the gate terminal of the test transistor 268 when the charge holding unit 230 connected to the gate terminal of the first amplification transistor 240 is reset and therefore the reset level is fixed.

In the solid-state image-capturing device 3 according to this embodiment, test transistors 268 equal in number to first amplification transistors 240 are necessary because a source follower circuit constituted of the test transistor 268 and the current source 280 is provided to form a pair with a source follower circuit constituted of the first amplification transistor 240 and the current source 280. Therefore, the test transistor 268 is necessary for every pixel when each pixel is independent and test transistor 268 is necessary for every pixel cell when a pixel cell is constituted of a plurality of pixels.

As described above, in the solid-state image-capturing device disclosed in Patent Literature 2, two transistors are necessary for every pixel when each pixel is independent and two transistors are necessary for every pixel cell when a pixel cell is constituted of a plurality of pixels. Therefore, according to this embodiment, it is possible to suppress an increase in the number of elements. In addition, it is possible to reduce the number of elements more than in the first and second embodiments.

While embodiments of the present invention have been described above in detail with reference to the drawings, specific configurations are not limited to the above embodiments and design changes and the like are also included without departing from the scope and spirit of the present invention. In the above description, the configuration of the solid-state image-capturing device in which the two substrates are connected by the connection unit is shown. However, three or more substrates may be connected by the connection unit. In the case of a solid-state image-capturing device in which the three or more substrates are connected by the connection unit, two of the three or more substrates correspond to the first substrate and the second substrate.

The present invention is widely applicable to a solid-state image-capturing device and an image-capturing device. According to the present invention, it is possible to reduce the occurrence of a blackening phenomenon while suppressing an increase in the number of elements.

What is claimed is:

1. A solid-state image-capturing device having a plurality of pixels and first and second substrates in which circuit elements constituting the pixels are arranged and which are electrically connected through a connection unit, the solid-state image-capturing device comprising:
    a photoelectric conversion element included in the pixel of the first substrate;
    a first current source;
    a first amplification transistor having a source or a drain connected to the first current source and a gate to which a signal generated by the photoelectric conversion element is input;
    a second current source;
    a switch configured to switch ON and OFF of a connection between a vertical signal line and the second current source and to be turned off when the gate of the first amplification transistor is reset;
    a voltage output circuit configured to output a power supply voltage to the vertical signal line when the gate of the first amplification transistor is reset;
    a clip transistor having one of a source and a drain connected to the vertical signal line, the other of the source and the drain connected to the first current source, and a gate to which a predetermined voltage for fixing a voltage output from the other of the source and the drain is input when the gate of the first amplification transistor is reset;
    a storage circuit included in the pixel of the second substrate and configured to store a signal amplified by the first amplification transistor and the clip transistor; and
    a second amplification transistor having one of a source and a drain connected to the vertical signal line and a gate to which the signal stored in the storage circuit is input.

2. A solid-state image-capturing device having a plurality of pixels and first and second substrates in which circuit elements constituting the pixels are arranged and which are electrically connected through a connection unit, the solid-state image-capturing device comprising:
    a photoelectric conversion element included in the pixel of the first substrate;
    a first current source;
    a first amplification transistor having a source or a drain connected to the first current source and a gate to which a signal generated by the photoelectric conversion element is input;
    a second current source connected to a vertical signal line and configured to switch ON and OFF and to be turned off when the gate of the first amplification transistor is reset;
    a voltage output circuit configured to output a power supply voltage to the vertical signal line when the gate of the first amplification transistor is reset;
    a clip transistor having one of a source and a drain connected to the vertical signal line, the other of the source and the drain connected to the first current source, and a gate to which a predetermined voltage for fixing a voltage output from the other of the source and the drain is input when the gate of the first amplification transistor is reset;

a storage circuit included in the pixel of the second substrate and configured to store a signal amplified by the first amplification transistor and the clip transistor; and a second amplification transistor configured to amplify the signal stored in the storage circuit to output the amplified signal to the vertical signal line.

3. A solid-state image-capturing device having a plurality of pixels and first and second substrates in which circuit elements constituting the pixels are arranged and which are electrically connected through a connection unit, the solid-state image-capturing device comprising:

a photoelectric conversion element included in the pixel of the first substrate;

a current source;

an amplification transistor having a source or a drain connected to the first current source and a gate to which a signal generated by the photoelectric conversion element is input;

a test transistor having one of a source and a drain connected to a test voltage corresponding to a reset level and a signal level during a test and connected to a power supply voltage when the gate of the amplification transistor is reset, the other of the source and the drain connected to the current source, and a gate to which a predetermined voltage for fixing a voltage output from the other of the source and the drain is input when the gate of the amplification transistor is reset;

a storage circuit included in the pixel of the second substrate and configured to store a signal amplified by the amplification transistor and the test transistor; and an output circuit configured to output the signal stored in the storage circuit.

4. An image-capturing device having the solid-state image-capturing device according to claim 1.

5. An image-capturing device having the solid-state image-capturing device according to claim 2.

6. An image-capturing device having the solid-state image-capturing device according to claim 3.

* * * * *